United States Patent
Fujimoto

(10) Patent No.: US 10,705,575 B2
(45) Date of Patent: Jul. 7, 2020

(54) HINGE DEVICE AND ELECTRONIC DEVICE

(71) Applicant: Sharp Kabushiki Kaisha, Sakai, Osaka (JP)

(72) Inventor: Hidetoshi Fujimoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 16/469,170

(22) PCT Filed: Aug. 30, 2017

(86) PCT No.: PCT/JP2017/031130
§ 371 (c)(1),
(2) Date: Jun. 13, 2019

(87) PCT Pub. No.: WO2019/043825
PCT Pub. Date: Mar. 7, 2019

(65) Prior Publication Data
US 2019/0354144 A1 Nov. 21, 2019

(51) Int. Cl.
*G06F 1/16* (2006.01)
*H05K 5/03* (2006.01)
*F16C 11/04* (2006.01)

(52) U.S. Cl.
CPC ............ *G06F 1/1681* (2013.01); *F16C 11/04* (2013.01); *G06F 1/1616* (2013.01);
(Continued)

(58) Field of Classification Search
CPC .... G06F 1/1681; G06F 1/1662; G06F 1/1637; G06F 1/1616; G06F 1/16; H05K 5/03; F16C 11/04
See application file for complete search history.

(56) References Cited

U.S. PATENT DOCUMENTS 9,348,363 B2 * 5/2016 Hui .................. G06F 1/1656
10,175,730 B2 * 1/2019 Lin ..................... G06F 1/16
(Continued)

FOREIGN PATENT DOCUMENTS

JP 06-250760 A 9/1994
JP 2011-119698 A 6/2011
(Continued)

OTHER PUBLICATIONS

Official Communication issued in International Patent Application No. PCT/JP2017/031130, dated Nov. 14, 2017.

*Primary Examiner* — Rockshana D Chowdhury
(74) *Attorney, Agent, or Firm* — Keating & Bennett, LLP

(57) ABSTRACT

A hinge device with a simple configuration and an electronic device are provided. The hinge device, is invisible between a first housing and a second housing from a front obliquely-upward direction, and is capable of preventing a lower end of the first housing from being covered by the second housing when the first housing is in an open state. A hinge device is provided between a display part and a keyboard part, and couples the display part to the keyboard part in an openable and closable manner. A U-shaped portion, which has a U-shaped cross section and one end portion formed integrally with the keyboard part, is included on a rear side of the keyboard part. A hinge portion is provided to the other end portion of the U-shaped portion to open and close the display part with respect to the keyboard part. The hinge portion supports a back surface of the display part, and is capable of rotating the display part. A recessed portion is formed in the one end portion of the U-shaped portion. The recessed portion prevents a lower end of the display part and the one end portion of the U-shaped portion from being brought into contact with each other when the display part is rotated.

13 Claims, 12 Drawing Sheets

(52) U.S. Cl.
CPC .......... *G06F 1/1637* (2013.01); *G06F 1/1662* (2013.01); *H05K 5/03* (2013.01)

(56) References Cited

U.S. PATENT DOCUMENTS

| | | |
|---|---|---|
| 2011/0102986 A1 | 5/2011 | Asakura et al. |
| 2012/0176740 A1 | 7/2012 | Nagasaki |
| 2013/0010405 A1* | 1/2013 | Rothkopf ............ H04M 1/0216 361/679.01 |
| 2015/0370289 A1* | 12/2015 | Ho ........................ G06F 1/1616 361/679.55 |
| 2016/0041589 A1* | 2/2016 | Tazbaz .................. G06F 1/1681 361/679.06 |

FOREIGN PATENT DOCUMENTS

| | | |
|---|---|---|
| JP | 2012-141915 A | 7/2012 |
| JP | 2017-083966 A | 5/2017 |
| WO | 2014/084818 A1 | 6/2014 |

\* cited by examiner

HINGE DEVICE AND ELECTRONIC DEVICE

TECHNICAL FIELD

The disclosure relates to a hinge device, which is provided between a first housing and a second housing and connects the second housing to the first housing in an openable and closable manner, and to an electronic device.

BACKGROUND ART

In a case of an electronic device such as a notebook-type personal computer including a display part and a main body part including a keyboard, a housing of the display part is coupled to a housing of the main body part by a hinge device in an openable and closable manner. The hinge device is provided to a portion being a center of closing and opening the two housings. When the electronic device is not used, the display part is closed by the hinge device and overlaps with the main body part. With this, the electronic device can be folded to a compact size.

In recent years, display technology has been developed, and a so-called frame width of four sides of a screen has a tendency of being reduced to substantially zero. In a case of a notebook-type personal computer including a display part having such substantially-zero frame width, when the notebook-type personal computer is designed with the known hinge device, the following two problems may arise.

As for the first problem, as illustrated in FIG. 11A, in an open state, when a display part 102 is provided on a far side of a main body part 101 including a keyboard, a lower end portion of a screen of the display part 102 is covered by the main body part 101.

Further, as for the second problem, as illustrated in FIG. 11B, under a state in which the display part 102 is in an open state, a hinge device 103 is visible between the main body part 101, including the keyboard, and the display part 102.

In view of this, to solve those problems, for example, a hinge disclosed in PTL 1 is known.

As illustrated FIG. 12A and FIG. 12B, a hinge 200 disclosed in PTL 1 is inserted in a main body part 201 including a keyboard when a display part 202 is in an open state. In this state, the hinge 200 is invisible.

CITATION LIST

Patent Literature

PTL 1: JP 2012-141915 A (published on Jul. 26, 2012).

SUMMARY

Technical Problem

However, the known hinge 200 disclosed in PTL 1 has a complex configuration to make the hinge 200 to be invisible by inserting the hinge 200 in the main body part 201 including the keyboard when the display part 202 is in an open state.

The disclosure has been made in view of the problems in the related art, and has an object to provide a hinge device with a simple configuration and an electronic device, the hinge device being invisible between a first housing and a second housing from a front obliquely-upward direction, and being capable of preventing a lower end of the first housing from being covered by the second housing when the first housing is in an open state.

Solution to Problem

To achieve the above-mentioned object, according to one aspect of the disclosure, there is provided a hinge device being provided between a first housing and a second housing and coupling the first housing to the second housing in an openable and closable manner, the hinge device including a U-shaped portion having a U-shaped cross section, the U-shaped portion has one end portion integrally formed with the second housing on a rear side of the second housing. A hinge portion is provided in another end portion of the U-shaped portion, the hinge portion supporting a back surface of the first housing in a rotatable manner to open and close the first housing with respect to the second housing. A recessed portion is formed in the one end portion of the U-shaped portion. The recessed portion prevents a lower end of the first housing and one end portion of the U-shaped portion from being brought into contact with each other when the first housing is rotated.

To achieve the above-mentioned object, according to one aspect of the disclosure, an electronic device includes the hinge device.

Advantageous Effects of Disclosure

According to one aspect of the disclosure, there can be exerted an effect of providing the hinge device with a simple configuration and the electronic device, the hinge device being invisible between the first housing and the second housing from the front obliquely-upward direction and being capable of preventing the lower end of the first housing from being covered by the second housing when the first housing is in an open state.

BRIEF DESCRIPTION OF DRAWINGS

Each of FIG. 5A

Each of FIG. 6A

DESCRIPTION OF EMBODIMENTS

First Embodiment

Description follows regarding one embodiment of the disclosure, on the basis of FIG. 1 to FIG. 7.

Figure 2A:
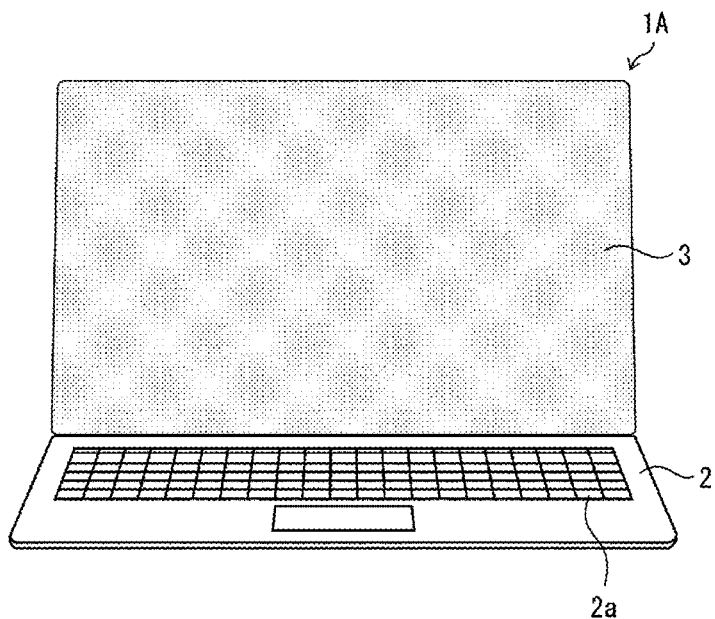
FIG. 2A is a perspective view for illustrating the electronic device in an open state.
Figure 2B:
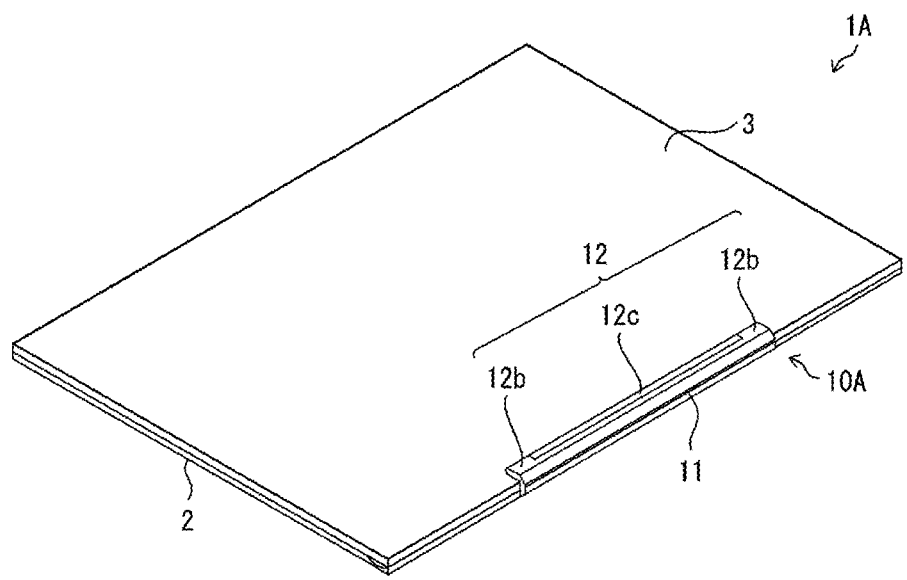
FIG. 2B is a perspective view of the electronic device in a close state.

With reference to FIG. 2A and FIG. 2B, description is made about a configuration of a notebook-type personal computer 1A as an electronic device including a hinge device 10A according to this embodiment. Note that, in this embodiment, description is made by exemplifying the notebook-type personal computer 1A as an electronic device. However, the electronic device is not necessarily limited to the notebook-type personal computer 1A, and may be, for example, a mobile phone and the like. FIG. 2A is a view for illustrating a configuration of the notebook-type personal computer 1A according to this embodiment, and a perspective view for illustrating the notebook-type personal computer 1A in an open state. FIG. 2B is a view for illustrating a configuration of the notebook-type personal computer 1A, and a perspective view for illustrating the notebook-type personal computer 1A in a close state.

As illustrated in FIG. 2A and FIG. 2B, the notebook-type personal computer 1A as an electronic device including the hinge device 10A according to this embodiment includes a keyboard part being a second housing and a display part 3 being a first housing.

The keyboard part 2 includes, for example, a keyboard 2a, and characters and the like can be input through the keyboard 2a. Note that, the keyboard part 2 in this embodiment includes the keyboard 2a as a physical key. However, the keyboard part 2 in this embodiment may not necessarily include the keyboard 2a as a physical key. For example, the key may be a touch display or a touch-type sheet key.

The display part 3 includes a display panel 3a, and the display panel 3a is formed of, for example, an organic EL display. However, the first housing in one aspect of the disclosure is not necessarily limited thereto, and is not particularly limited as long as the display panel includes an optical element. The above-mentioned optical element includes an optical element having luminance or a transmittance controlled by current and an optical element having luminance or a transmittance controlled by voltage. Examples of the current-controlled optical element include organic electro luminescence (EL) displays equipped with organic light emitting diodes (OLED), EL displays such as inorganic EL displays provided with inorganic light emitting diodes, and quantum dot light emitting diode (QLED) displays equipped with QLED. Further, examples of a voltage-controlled optical element include a liquid crystal display element and the like.

Particularly, in this embodiment, an entire surface of the display part 3 is a display screen, and a so-called frame is not provided to peripheral sides of the screen. For example, the keyboard part 2 has a lateral dimension from 300 mm to 350 mm, a vertical dimension from 170 mm to 200 mm, and a thickness dimension from 6 mm to 7 mm. For example, the display part 3 has a lateral dimension from 300 mm to 350 mm, a vertical dimension from 170 mm to 200 mm, and a thickness dimension from 3.5 mm to 4.5 mm. Note that, those numeral values are merely examples. For example, when the thickness of the keyboard part 2 and the thickness of the display part 3 are different from each other, the dimension of the hinge device 10A differs.

As described above, the keyboard part 2 and the display part 3 of the notebook-type personal computer 1A according to this embodiment has the same configuration as a general notebook-type personal computer except for the point that the display part 3 does not have a so-called frame. Note that, in this embodiment, a so-called frame is not provided to the display part 3 at all. However, one aspect of the disclosure is not limited to a case where a so-called frame is completely absent, and includes a case where a so-called frame is small.

The hinge device 10A configured to couple the display part 3 to the keyboard part 2 in an openable and closable manner is provided between the keyboard part 2 and the display part 3.

Figure 1:
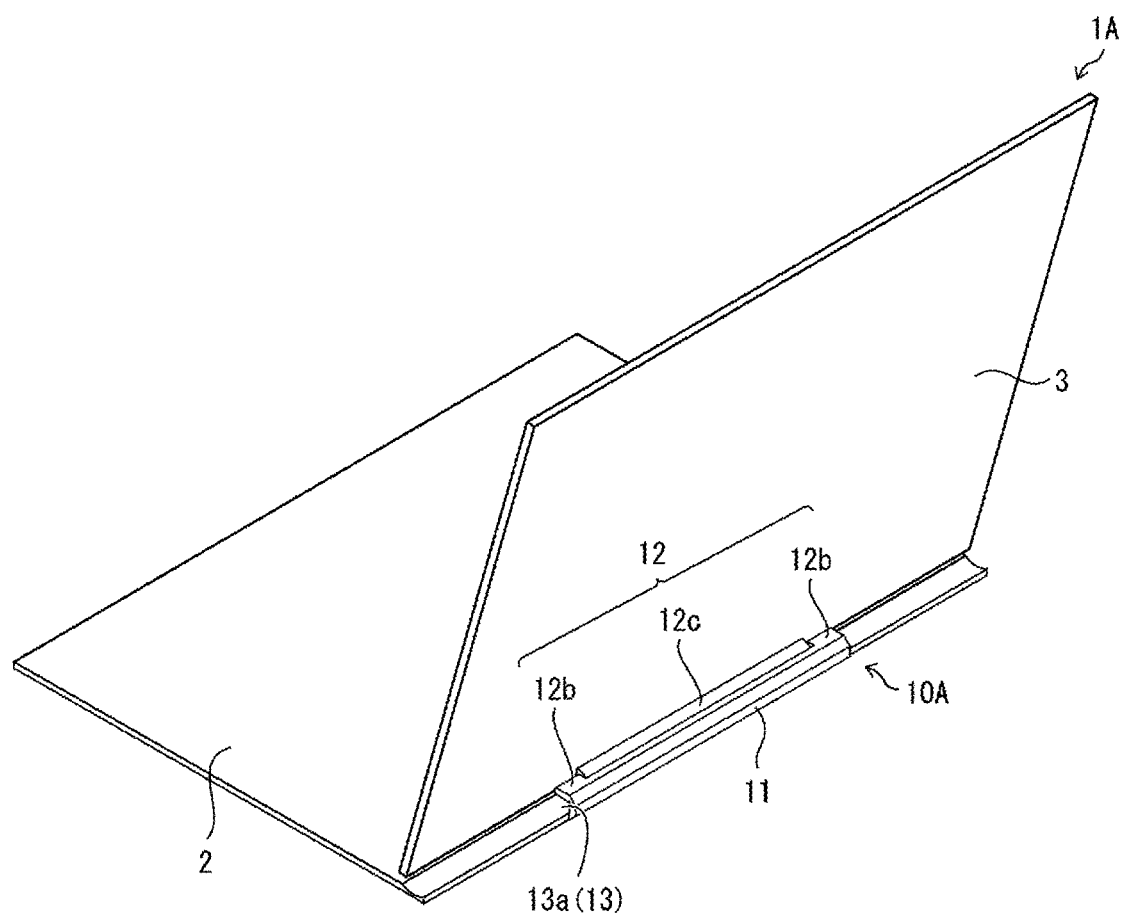
FIG. 1 is a perspective view for illustrating a configuration of a hinge device according to a first embodiment of the disclosure.
Figure 3A:
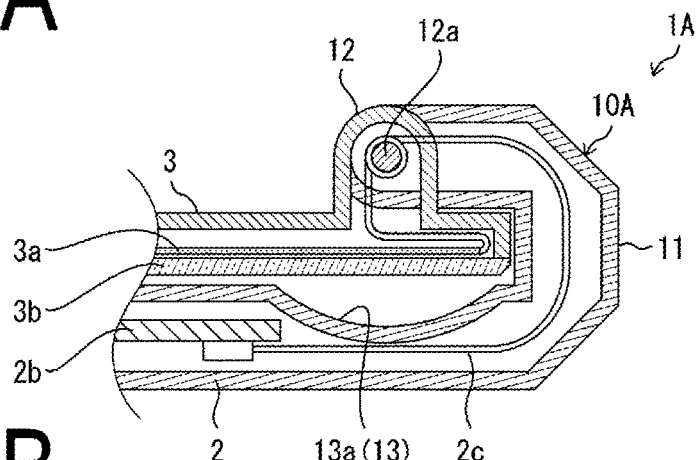
FIG. 3A is a cross-sectional view for illustrating main portions of the electronic device in a close state.
Figure 3B:
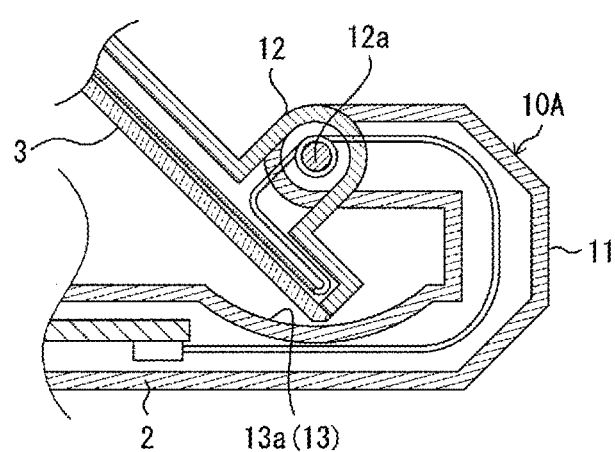
FIG. 3B is a cross-sectional view for illustrating the main portions of the electronic device in a transition state from the close state to the open state.
Figure 3C:
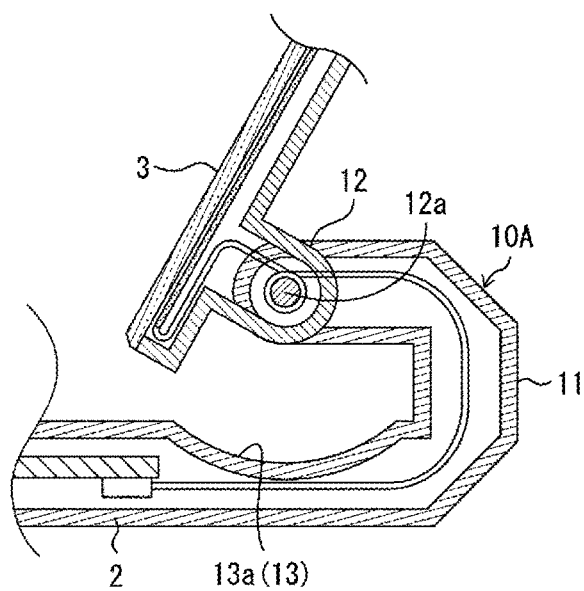
FIG. 3C is a cross-sectional view for illustrating the main portion of the electronic device in the open state.
Figure 4A:
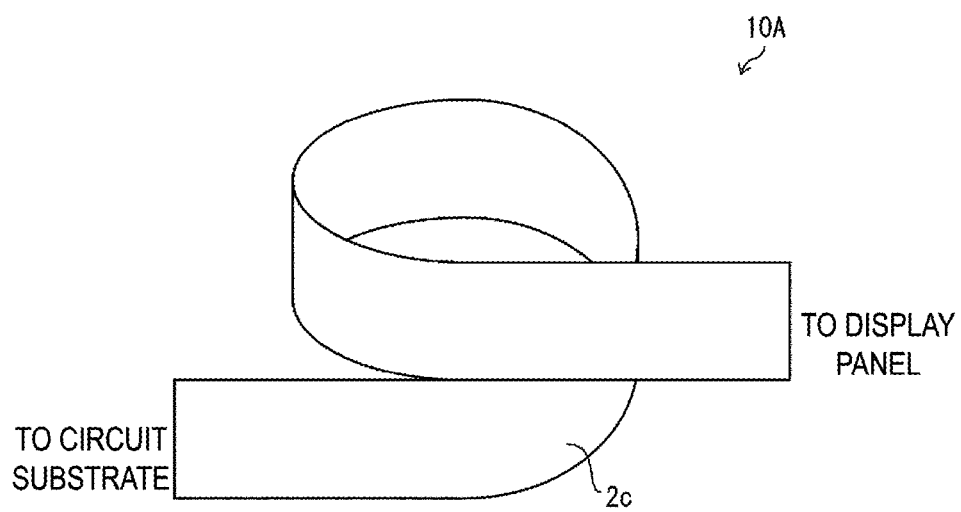
FIG. 4A is a perspective view for illustrating a configuration of a flexible circuit of the electronic device.
Figure 4B:
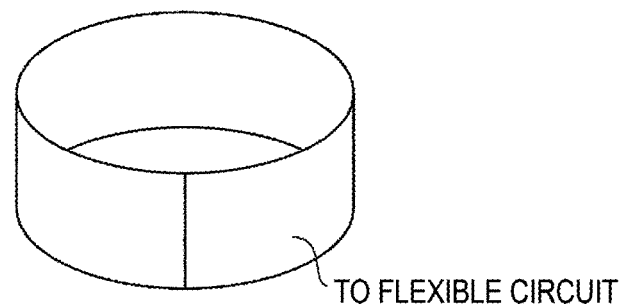
FIG. 4B is a perspective view for illustrating a configuration of a general flexible circuit.

With reference to FIG. 1, FIG. 3A, FIG. 3B, FIG. 3C, FIG. 4A, and FIG. 4B, description is made about a detail configuration of the hinge device 10A according to this embodiment. FIG. 1 is a perspective view for illustrating a configuration of the hinge device 10A according to this embodiment. FIG. 3A is a cross-sectional view for illustrating main portions of the notebook-type personal computer 1A according to this embodiment in the close state. FIG. 3B is a cross-sectional view for the main portions of the electronic device in a transition state from the close state to the open state. FIG. 3C is a cross-sectional view for illustrating the main portions of the electronic device in the open state. FIG. 4A is a perspective view for illustrating a configuration of a flexible circuit 2c of the notebook-type personal computer 1A. FIG. 4B is a perspective view for illustrating a configuration of a general flexible circuit.

As illustrated in FIG. 3A, FIG. 3B, and FIG. 3C, the hinge device 10A according to this embodiment includes a U-shaped portion 11 having a U-shaped cross section, which has one end portion integrally formed to the keyboard part 2 on a rear side of the keyboard part 2. Note that, in one aspect of the disclosure, the U-shaped portion 11 of the hinge device 10A is molded integrally with the keyboard part 2, and there is no joint between the one end portion of the U-shaped portion 11 and a far-side end of the keyboard part 2. However, in one aspect of the disclosure, the U-shaped portion 11 is not necessarily required to be formed integrally with the keyboard part 2 by molding the U-shaped portion 11 integrally with the keyboard part 2. For example, the U-shaped portion 11 and the keyboard part 2 may be provided separately from each other, and the U-shaped portion 11 may be integrated with the keyboard part 2 by joining the one end portion of the U-shaped portion 11 to the rear side of the keyboard part 2 by, for example, screw fastening, adhesion, and welding.

For example, the U-shaped portion 11 has an inner width dimension from 4.5 mm to 5.5 mm. For example, a dimension from a farmost surface of the U-shaped portion 11 to a center of a pin 12a of a hinge portion 12 described later is from 5.0 mm to 6.5 mm. However, the dimension from the farmost surface of the U-shaped portion 11 to the center of the pin 12a of the hinge portion 12 may be larger than the dimension described above.

The hinge portion 12 is provided to the other end of the U-shaped portion 11 in this embodiment to open and close the display part 3. The hinge portion 12 supports a back surface of the display part 3, and is capable of rotating the display part 3.

The hinge portion 12 is configured by including the pin 12a being a rotary shaft as illustrated in FIG. 3A, two U-shaped portion-side pin support members 12b fixed to the U-shaped portion 11 as illustrated in FIG. 2B, and a display part-side pin support member 12c, which is fixed to the display part 3 and provided between the two U-shaped portion-side pin support members 12b and 12b. The U-shaped portion-side pin support members 12b and 12b, and the display part-side pin support member 12c support the pin 12a in a freely turnable manner. Note that, in this embodiment, the U-shaped portion-side pin support members 12b and 12b provided on both sides are supported and fixed by the U-shaped portion 11, the display part-side pin support member 12c sandwiched between the U-shaped portion-side pin support members 12b and 12b is supported and fixed by the display part 3. However, the disclosure is not necessarily limited thereto, and the positions of the pin support members may be reversed.

Here, in the hinge device 10A according to this embodiment, the hinge portion 12 supports the back surface of the display part 3 at a position shifted in a direction from a lower end to an upper end of the display part 3. Specifically, for example, a distance from the lower end of the display part 3 and the center position of the pin 12a being a rotary shaft of the hinge portion 12 is from 4.5 mm to 6.0 mm. For example, in a case where the hinge portion supports the back surface of the display part 3 at the lower end position of the display part 3, when the display part 3 is in the open state with respect to the keyboard part 2, the distance between the lower end of the display part 3 and the far-side end of the keyboard part 2 is increased. Thus, when the display part 3 is in the open state, there is a possibility that the hinge device is visible from a front obliquely-upward direction between the display part 3 and the keyboard part 2. Further, for example, such problem that a finger is caught between the lower end of the display part 3 and the far-side end of the keyboard part 2 arises.

However, in this embodiment, the hinge portion 12 supports the back surface of the display part 3 at a position shifted in a direction from a lower end to an upper end of the display part 3. Thus, when the display part 3 is in the open state, a possibility that the hinge device 10A is visible from the front obliquely-upward direction between the display part 3 and the keyboard part 2 and a possibility of causing the problem that a finger is caught between the lower end of the display part 3 and the far-side end of the keyboard part 2 are lowered.

Specifically, for example, in the case where the display part 3 is in the open state, it is conceived that the hinge device 10A is visible when viewed from a direction parallel to the surface of the keyboard part 2. However, an operator is not expected to view the notebook-type personal computer 1A at such angle during normal use, but is expected to view the notebook-type personal computer 1A from a front upper side. Thus, in the case where the notebook-type personal computer 1A is viewed from the front upper side, when the hinge device 10A is invisible, it is determined that the operator performs operation without being bothered by the hinge device 10A.

As a result, in one aspect of the disclosure, it is determined to be satisfactory that the hinge device 10A is invisible when viewed from the front upper side as in the normal use by the operator. Note that, in the notebook-type personal computer 1A according to this embodiment, the distance between the keyboard part 2 and the display part 3 in the case where the display part 3 is in the open state during the normal use is, for example, substantially 4 mm.

Note that, the distance between the hinge portion 12 and the lower end of the display part 3 is increased, a depth length of the U-shaped portion 11 is increased.

Further, in the hinge device 10A according to this embodiment, the length of the hinge portion 12 in a direction parallel to the pin 12a being a rotary shaft for the display part 3 and the keyboard part 2, is a part of a length of the display part 3 in a direction parallel to the pin 12a.

With this structure, the hinge portion 12 and the hinge device 10A can be reduced in weight. Further, an excellent appearance is achieved as a design. Moreover, the notebook-type personal computer 1A can be held by holding the U-shaped portion 11 as a grip. Further, for example, in a case where a battery or the like is mounted to a part of the keyboard part 2 on the far side, the hinge portion 12 can be provided at a position avoiding the battery mounting position.

Note that, in this embodiment, the length of the hinge portion 12 in the direction parallel to the pin 12a being the rotary shaft for the display part 3 and the keyboard part 2 is a part of the length of the display part 3 in a direction parallel to the pin 12a. However, one aspect of the disclosure is not limited thereto. For example, the length of the hinge portion 12 in the direction parallel to the pin 12a may be an entire length of the display part 3 in a direction parallel to the pin 12a. With this structure, the hinge portion 12 can exert a higher supporting force for the display part 3 and the keyboard part 2. Further, the hinge device 10A is integrated with the display part 3 and the keyboard part 2. Thus, in any of the open state and the close state of the notebook-type personal computer 1A, the hinge device 10A can be inconspicuous.

Further, as illustrated in FIG. 3A, in the notebook-type personal computer 1A according to this embodiment, a circuit substrate 2b is provided inside the keyboard part 2. Further, the flexible circuit 2c is connected to an end portion of the circuit substrate 2b. The flexible circuit 2c passes through the inside of the U-shaped portion 11, and is connected to the display panel 3a provided inside the display part 3.

In this embodiment, the flexible circuit 2c has a width length equal to or smaller than at least half of a width of the display panel 3a, and is wound about the pin 12a being the rotary shaft of the hinge portion 12 without being fixed to the pin 12a.

Here, in general, when the flexible circuit is wound, free ends of the flexible circuit on both sides are aligned as illustrated in FIG. 4B. However, in this embodiment, as illustrated in FIG. 4A, the free ends of the flexible circuit 2c on both the sides are alternated. With this structure, a high elasticity can be provided to the flexible circuit 2c, and the display part 3 of the notebook-type personal computer 1A easily opens and closes.

A glass plate 3b is provided as a protection member on the surface of the display part 3. For example, the U-shaped portion 11 has an inner width from 5.0 mm to 6.0 mm.

Now, with the hinge device 10A according to this embodiment, description is made of the case where the display part 3 is turned to open and close the display part 3 with respect to the keyboard part 2. In this case, when the distance between the lower end of the display part 3 and the far-side end of the keyboard part 2 is sufficient, the display part 3 is turned freely. In this manner, the display part 3 can freely open and close with respect to the keyboard part 2. However, in the case of such design, when the display part 3 is in the open state with respect to the keyboard part 2, a gap between the lower end of the display part 3 and the far-side end of the keyboard part 2 is generated, which leads to an unpleasant view.

In the notebook-type personal computer 1A according to this embodiment, the display part 3 does not have a so-called frame. Thus, in the case where the display part 3 is in the open state, it is preferred that the lower end of the display part 3 be prevented from being covered by the keyboard part 2 when viewed from the front obliquely-upward direction.

Here, when the display part 3 is in the open state with respect to the keyboard part 2, and is viewed from the front obliquely-upward direction, the lower end of the display part 3 and the far-side end of the keyboard part 2 are required to be close to each other as much as possible to satisfy the preferred condition described above and prevent the gap between the lower end of the display part 3 and the far-side end of the keyboard part 2 from being generated.

However, in the case of such design, the lower end of the display part 3 is brought into contact with the one end portion of the U-shaped portion 11 while the display part 3 is turned.

In view of this, in the hinge device 10A according to this embodiment, as illustrated in FIG. 1, a recessed portion 13 is formed in the one end portion of the U-shaped portion 11. The recessed portion 13 prevents the lower end of the display part 3 and the one end portion of the U-shaped portion 11 from being brought into contact with each other when the display part 3 is rotated. With this, in the case where the display part 3 is in the open state with respect to the keyboard part 2, even when the lower end of the display part 3 and the far-side end of the keyboard part 2 are close as much as possible, the lower end of the display part 3 is not brought into contact with the one end portion of the U-shaped portion 11 when the display part 3 is rotated. As a result, the display part 3 can be turned without any problem.

Here, particularly in this embodiment, the recessed portion 13 is an arc-shaped recessed portion 13a having an arc-shaped cross section. The arc-shaped recessed portion 13a has such curvature as to have a circular cross section along a turning radius of the display part 3. As a result, the cross section of the recessed portion 13 can be reduced. Thus, degradation in strength of the hinge device 10A can be prevented.

With reference to FIG. 3A, FIG. 3B, and FIG. 3C, description is made about an opening movement of the notebook-type personal computer 1A including the hinge device 10A according to this embodiment.

As illustrated in FIG. 3A, when the display part 3 is in the close state, the display part 3 is folded to be parallel to the keyboard part 2. At this state, the hinge portion 12 of the hinge device 10A is in a state of being on an end portion of the display part 3.

In order that the display part 3 is shifted from this state to the open state, the display part 3 is turned about the pin 12a of the hinge portion 12. As illustrated in FIG. 3B, the arc-shaped recessed portion 13a is formed in the one end portion of the U-shaped portion 11. Thus, the lower end of the display part 3 is not brought into contact with the one end portion of the U-shaped portion 11. Thus, as illustrated in FIG. 3C, the operator can turn the display part 3 without any problem to obtain an easily-observable angle. Further, in a state where the operator is viewing from the front, the hinge portion 12 is covered by the back surface of the display part 3 due to the opening movement of the display part 3 by turning the display part 3. Moreover, in a state where the operator is viewing from the front, nothing seems to be present between the end portion of the display part 3 and the far end portion of the keyboard part 2. The display part 3 seems to be on the keyboard part 2.

With this, as illustrated in FIG. 2A, in the open state of the display part 3, the hinge device is invisible between the display part 3 and the keyboard part 2 when the notebook-type personal computer 1A is viewed from the front obliquely upward direction. Moreover, the lower end of the display part 3 can be prevented from being covered by the keyboard part 2.

As described above, the hinge device 10A according to this embodiment is provided between the display part 3 being the first housing and the keyboard part 2 being the second housing, and couples the display part 3 to the keyboard part 2 in an openable and closable manner. Further, the U-shaped portion 11, which has a U-shaped cross section and one end portion formed integrally with the keyboard part 2, is included on the rear side of the keyboard part 2. The hinge portion 12 is provided to the other end portion of the U-shaped portion 11 to open and close the display part 3 with respect to the keyboard part 2. The hinge portion 12 supports a back surface of the display part 3, and is capable of rotating the display part 3. The recessed portion 13 is formed in the one end portion of the U-shaped portion 11. The recessed portion 13 prevents the lower end of the display part 3 and the one end portion of the U-shaped portion 11 from being brought into contact with each other when the display part 3 is rotated.

With this, in the case where the display part 3 is in the open state with respect to the keyboard part 2, even when the lower end of the display part 3 and the far-side end of the keyboard part 2 are close as much as possible, the display part 3 can be turned because the recessed portion 13 is formed in the one end portion of the U-shaped portion 11.

Further, the hinge device 10A includes one end portion in which the recessed portion 13 is formed and the other end portion which is configured with the U-shaped portion 11 including the hinge portion 12. Thus, the configuration thereof is simple. Specifically, the hinge device 10A includes the only one hinge portion 12 configured to turn the display part 3, and the hinge portion 12 is present on the back surface of the display part 3. Further, the recessed portion 13 is merely formed in the one end portion of the U-shaped portion 11.

Therefore, the hinge device 10A with a simple configuration, which is invisible between the display part 3 and the keyboard part 2 when viewed from the front obliquely-upward direction in the open state of the display part 3 and is capable of preventing the lower end of the display part 3 from being covered by the keyboard part 2, can be provided. As a result, a design that is excellent in appearance can be achieved.

Further, in the hinge device 10A according to this embodiment, the hinge portion 12 supports the back surface of the display part 3 at a position shifted in a direction from a lower end to an upper end of the display part 3. Thus, when the display part 3 is in the open state, a possibility that the hinge device 10A is visible from the front obliquely-upward direction between the display part 3 and the keyboard part 2 and a possibility that a finger is caught between the lower end of the display part 3 and the far-side end of the keyboard part 2 are lowered.

Further, the hinge device 10A according to this embodiment, the recessed portion 13 is formed of the arc-shaped recessed portion 13a having an arc-shaped cross section. As a result, the cross section of the recessed portion 13 can be reduced. Thus, degradation in strength of the hinge device 10A can be prevented.

Further, in the hinge device 10A according to this embodiment, the length of the hinge portion 12 in a direction parallel to the pin 12a being the rotary shaft for the display part 3 and the keyboard part 2, is a part of or an entirety of the length of the display part 3 in a direction parallel to the pin 12a.

With this, the length in the direction parallel to the pin 12a of the hinge portion 12 may be the entire width length of the display part 3. Thus, the hinge portion 12 can exert a higher supporting force for the display part 3 and the keyboard part 2. Further, the length of the hinge portion 12 in the direction parallel to the pin 12a may be a part of the width length of the display part 3. Thus, the hinge portion 12 and the hinge device 10A can be reduced in weight.

Further, the hinge device 10A according to this embodiment, the display part 3 includes the display panel 3a, and the keyboard part 2 includes the circuit substrate 2b. Further, the hinge portion 12 includes the pin 12a being the rotary shaft. Further, the display panel 3a and the circuit substrate 2b are electrically connected through the flexible circuit 2c. Moreover, the flexible circuit 2c has a width equal to or smaller than at least half of a width length of the display panel 3a, and is wound about the pin 12a being the rotary shaft not to be fixed to the pin 12a. Further, the flexible circuit 2c toward the display panel 3a and the flexible circuit 2c toward the circuit substrate 2b are wound alternately.

With this structure, even when the display part 3 and the keyboard part 2 open or close, the flexible circuit 2c moves with a certain tension. Thus, the flexible circuit 2c assists an opening and closing movement of the display part 3 and the keyboard part 2. As a result, breakage of the flexible circuit 2c, which is caused by a large tension applied to the flexible circuit 2c, can be prevented.

Further, the hinge device 10A according to this embodiment, the hinge portion 12 is provided on the back surface of the display part 3. When the display part 3 is in the open state, the hinge portion 12 is configured not to be exposed from the display part 3. With this, the hinge device 10A excellent in design can be provided.

The notebook-type personal computer 1A according to this embodiment as an electronic device includes the hinge device 10A according to this embodiment. With this, the notebook-type personal computer 1A including the hinge device 10A with a simple configuration, which is invisible between the display part 3 and the keyboard part 2 when viewed from the front obliquely-upward direction in the open state of the display part 3 and is capable of preventing the lower end of the display part 3 from being covered by the keyboard part 2, can be provided.

Note that, one aspect of the disclosure is not limited to the above-mentioned embodiment, and various changes can be made within the scope of the disclosure. For example, in the above-mentioned embodiment, the recessed portion 13 is formed of the arc-shaped recessed portion 13a. That is, one arc portion is provided. However, one aspect of the disclosure is not necessarily limited thereto. For example, a recessed portion having an S-shaped cross section, which is obtained by forming an arc portion continuously to the one arc-shaped recessed portion 13a on the keyboard part 2 side, may be adopted. With this structure, a smooth connection surface between a top surface of the keyboard part 2 and the recessed portion 13 can be obtained.

Further, in this embodiment, the hinge portion 12 is arranged on the far end portion of the keyboard part 2. However, the disclosure is not limited thereto. The hinge portion 12 may be arranged on a slightly front side with respect to the keyboard part 2. With this, for example, a battery or the like can be arranged on the rear end portion side of the hinge portion 12.

Figure 5A:
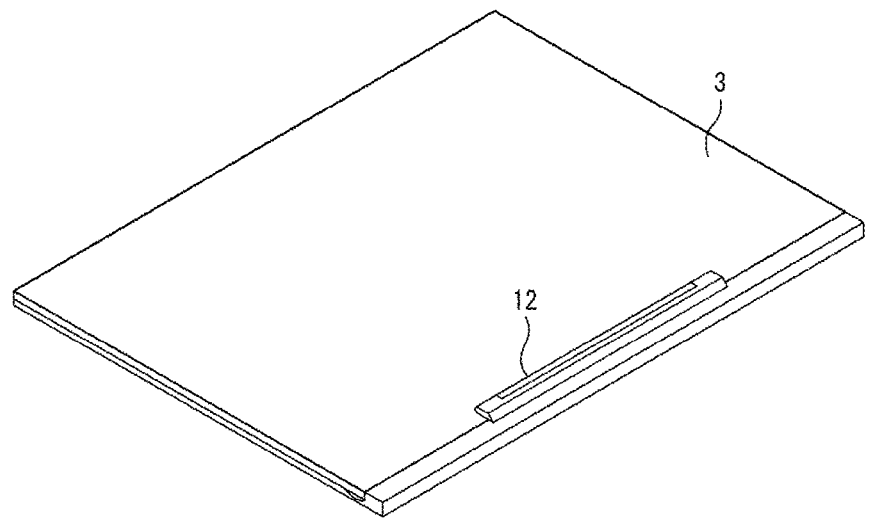
FIG. 5B is a perspective view for illustrating a configuration of a hinge device in a modification example according to the first embodiment of the disclosure.

Here, with reference to the drawings, description is made about various modification examples of the hinge device 10A according to this embodiment. For example, as a modification example of the hinge device 10A, as illustrated in FIG. 5A, the hinge portion 12 can be arranged at a position on an inner side of the display part 3.

Figure 5B:
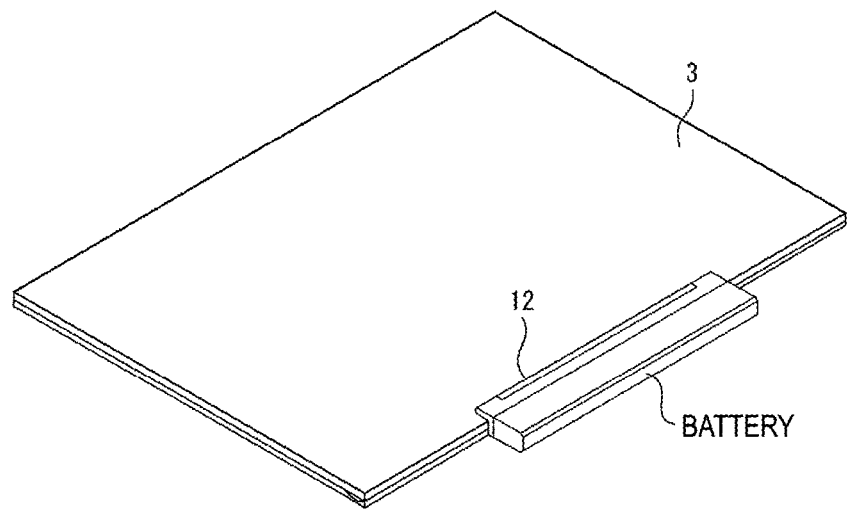

Further, FIG. 5B is a view for illustrating a shape in which a battery or the like is arranged on the rear end portion side of the hinge portion 12 as described above.

Figure 6A:
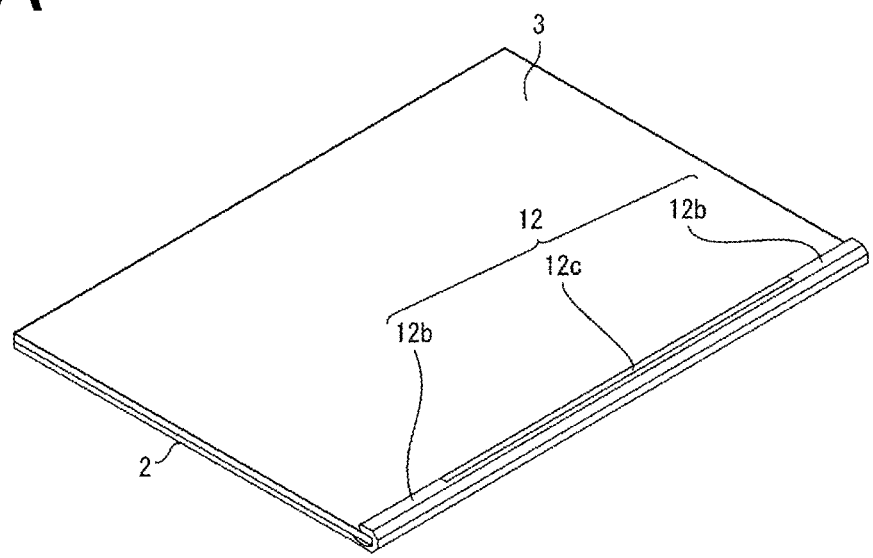
FIG. 6B is a perspective view for illustrating a configuration of a hinge device in another modification example according to the first embodiment of the disclosure.

Moreover, as illustrated in FIG. 6A, as compared to FIG. 1, a width of the hinge portion 12 may be increased, and a width of the hinge portion 12 and the widths of the keyboard part 2 and the display part 3 may be, for example, equal to one other.

Figure 6B:
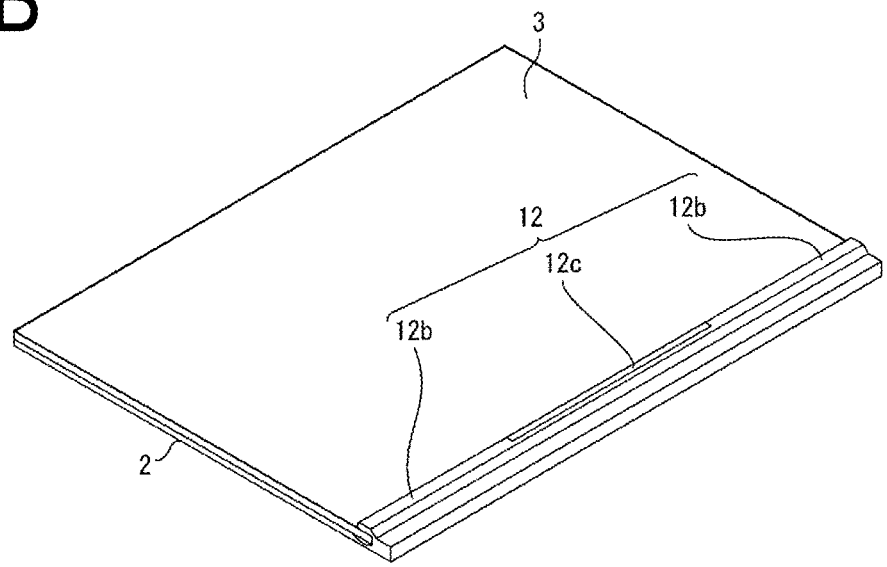

Further, as illustrated in FIG. 6B, the hinge portion 12 may be arranged at a position on the inner side of the display part 3.

Moreover, the state illustrated in FIG. 6A is obtained from the hinge portion 12 arranged at the position on the inner side of the display part 3, which is illustrated in FIG. 5A, in the following manner. That is, as compared to FIG. 1, the width of the hinge portion 12 is increased, and the width of the hinge portion 12 and the widths of the keyboard part 2 and the display part 3 are, for example, equal to one other.

Figure 7:
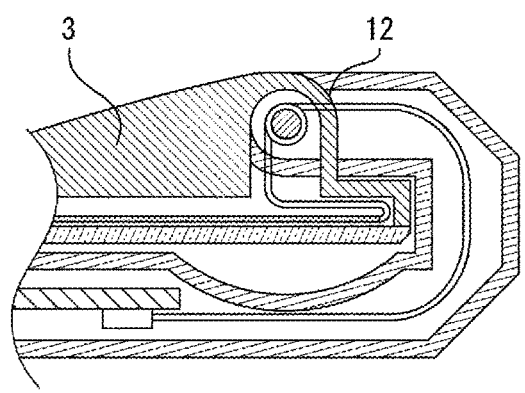
FIG. 7 is a cross-sectional view for further illustrating a configuration of a hinge device in another modification example according to the first embodiment of the disclosure.

Moreover, as illustrated in FIG. 7, a thickness of the display part 3 on the rear end side can be formed larger than a thickness on the front end side. With this, formation of a step can be prevented between the hinge portion 12 and the display part 3.

Second Embodiment

Figure 8:
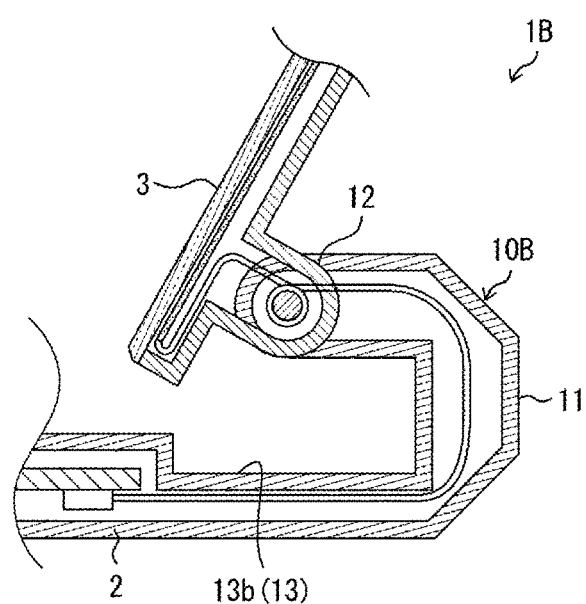
FIG. 8 is a cross-sectional view for illustrating a configuration of a hinge device of an electronic device according to a second embodiment of the disclosure in an open state of the electric device.

Description follows regarding another embodiment of the disclosure, with reference to FIG. 8. Note that, the configuration other than that described in this embodiment is the same as the first embodiment. Further, for convenience of the description, members having the same functions as those of the members illustrated in the diagrams in the first embodiment are denoted by the same reference symbols, and description thereof is omitted.

In the hinge device 10A of the notebook-type personal computer 1A according to the first embodiment, the recessed portion 13 formed in the one end portion of the U-shaped portion 11 is formed of the arc-shaped recessed portion 13a. A hinge device 10B of a notebook-type personal computer 1*b* according to this embodiment is different from the above-mentioned structure in that the recessed portion 13 formed in the one end portion of the U-shaped portion 11 is formed of a rectangular recessed portion 13*b*.

With reference to FIG. 8, description is made about the hinge device 10B of the notebook-type personal computer 1B according to this embodiment. FIG. 8 is a cross-sectional view for illustrating a configuration of the hinge device 10B of the notebook-type personal computer 1B according to this embodiment in an open state of the notebook-type personal computer 1B.

As illustrated in FIG. 8, in the hinge device 10B according to this embodiment, the recessed portion 13 have a cross section to be formed in a rectangular shape, and is the rectangular recessed portion 13*b*. Note that, the rectangular recessed portion 13*b* is not necessarily limited to a rectangular shape such as a rectangle and a square, and may be a rectangular shape such as trapezoid.

The rectangular recessed portion 13*b* may be subjected to linear processing when the recessed portion 13 is formed. As a result, there is an advantage in that processing is easily performed when the recessed portion 13 is formed.

Third Embodiment

Figure 9A:
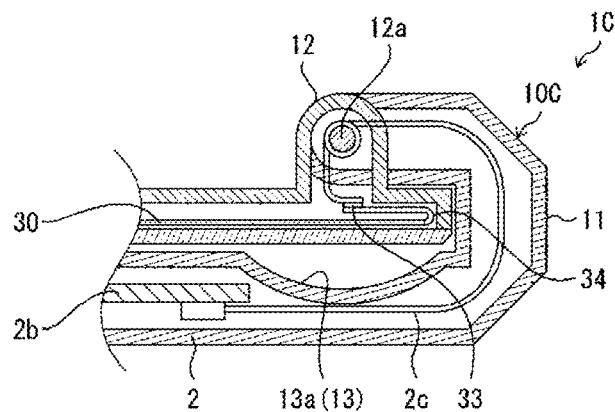
FIG. 9A is a cross-sectional view for illustrating a configuration of a hinge device of an electronic device according to a third embodiment of the disclosure.
Figure 9B:
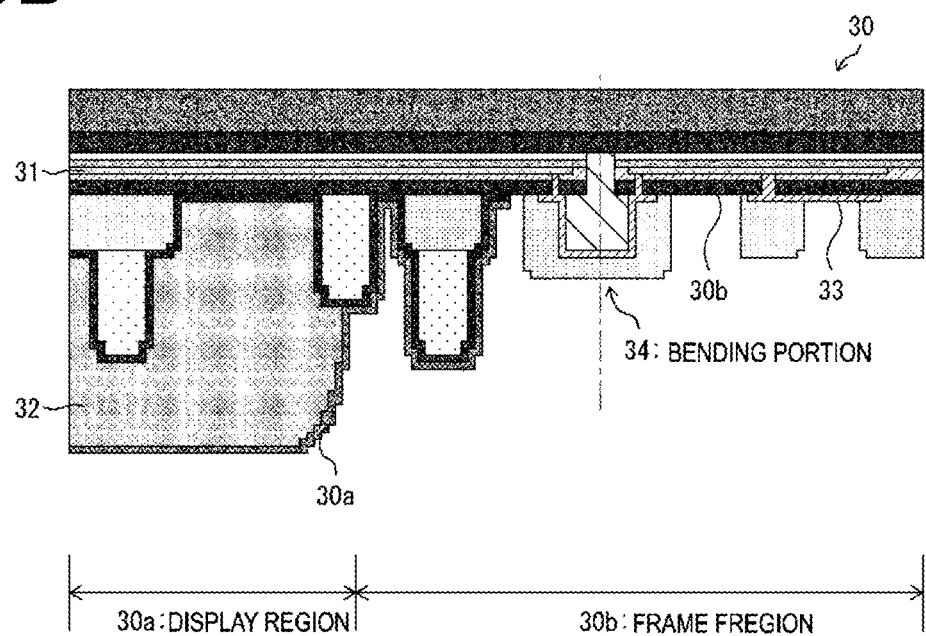
FIG. 9B is a cross-sectional view for illustrating a configuration of a display panel of the electronic device.
Figure 10:
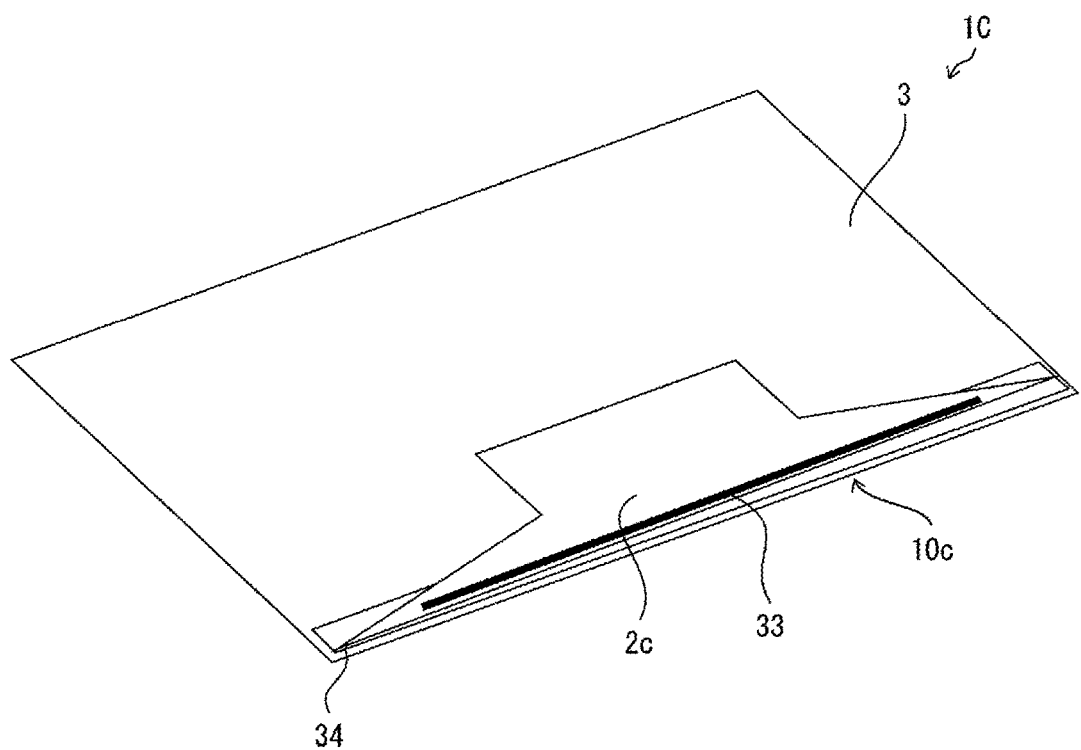
FIG. 10 is a perspective view for illustrating a configuration of a bending portion and a flexible circuit of the display panel.
Figure 11A:
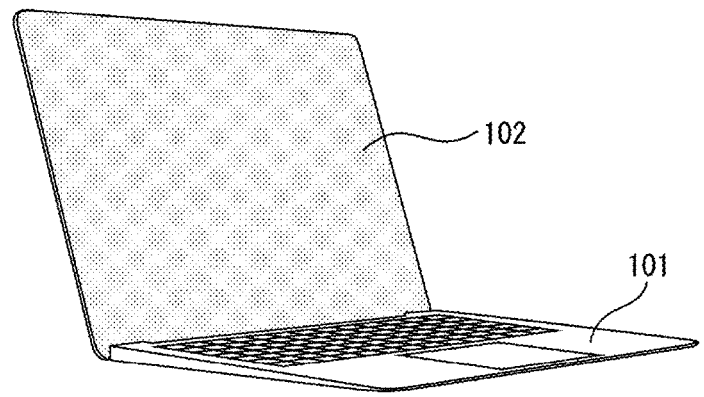
FIG. 11A is a perspective view for illustrating an electronic device under a state in which a lower end of a display part is covered by a main body part when a known electronic display is in an open state.
Figure 11B:
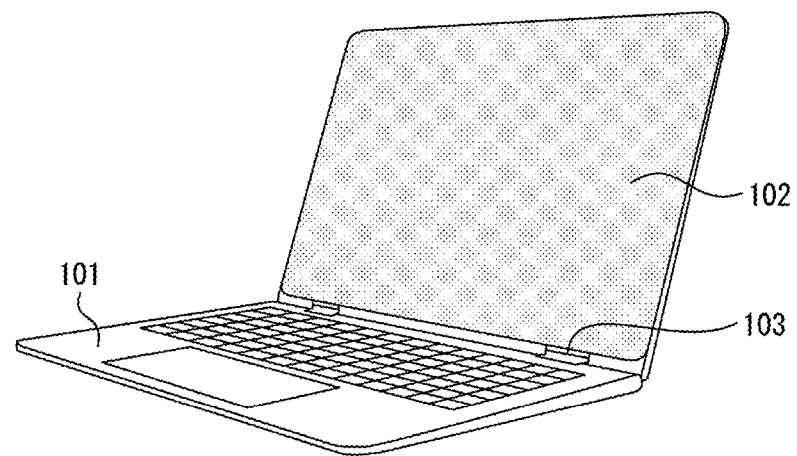
FIG. 11B is a perspective view of the electronic device under a state in which a gap and a hinge device are visible between the display part and the main body part when the known electronic device is in the open state.
Figure 12A:
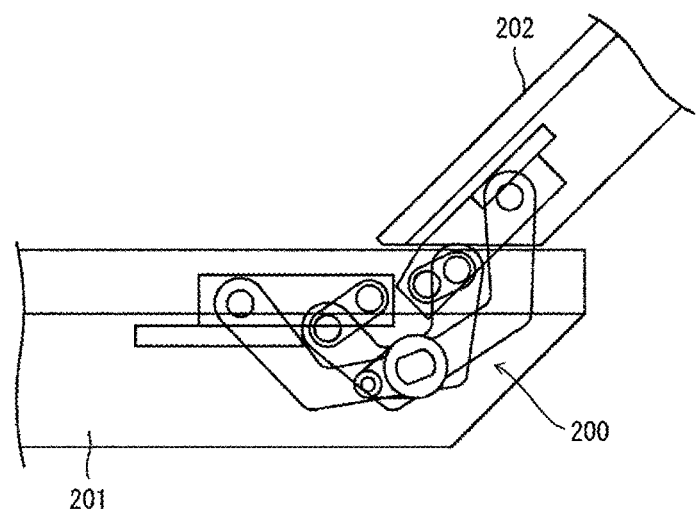
FIG. 12A is a cross-sectional view for illustrating another known electronic device in an open state.
Figure 12B:
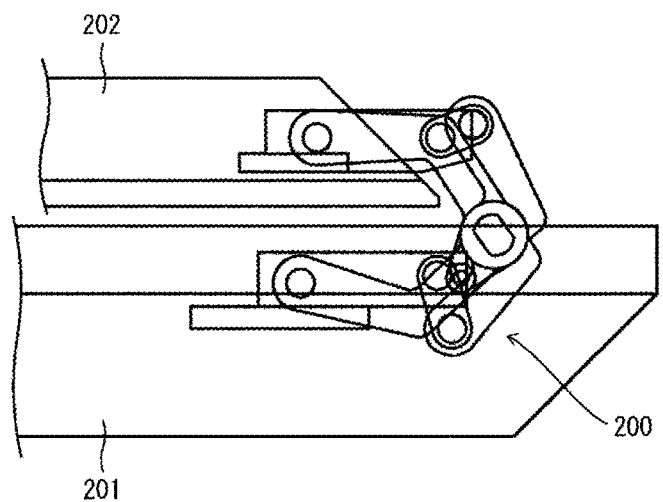
FIG. 12B is a cross-sectional view of the other known electronic device in a close state.

Description follows regarding another embodiment of the disclosure, with reference to FIG. 9A, FIG. 9B and FIG. 10. Note that, the configuration other than that described in this embodiment is the same as the first and second embodiments. Further, for convenience of the description, members having the same functions as those of the members illustrated in the diagrams in the first and second embodiments are denoted by the same reference symbols, and description thereof is omitted.

In the notebook-type personal computers 1A and 1B according to the first and second embodiments, the display panel 3*a* of the display part 3 is formed of a rigid substrate. In contrast, a notebook-type personal computer 1C according to this embodiment is different from the notebook-type personal computers 1A and 1B in that the display panel 30 is formed of a flexible substrate.

Specifically, in the case where the display panel 30 is formed of a flexible substrate, the problem is how to connect the flexible circuit 2*c*, which connects the keyboard part 2 being the second housing and the display panel 30 being the first housing to each other, to the display panel 30. In this embodiment, description is made of a method of connecting the flexible circuit 2*c* to the display panel 30 when the display panel 30 is formed of a flexible substrate.

With reference to FIG. 9A, FIG. 9B, and FIG. 10, description is made of a hinge device 10C of the notebook-type personal computer 1C according to this embodiment. FIG. 9A is a cross-sectional view for illustrating a configuration of the hinge device 10C of the notebook-type personal computer 1C according to this embodiment. FIG. 9B is a cross-sectional view for illustrating a configuration of the display panel 30 of the notebook-type personal computer 1C. Note that, FIG. 9B is a view for illustrating a state in which the display panel 30 is not folded in a frame region 30*b* but a display region 30*a* and the frame region 30*b* spread on the same surface. FIG. 10 is a perspective view for illustrating a configuration of a bending portion 34 of the display panel 30 and the flexible circuit 2*c*.

As illustrated in FIG. 9A, FIG. 9B, and FIG. 10, in the hinge device 10C of the notebook-type personal computer 1C according to this embodiment, the display panel 30 of the display part 3 is formed of a flexible substrate.

In the display panel 30, a TFT layer 31 is provided on the substrate, and a plurality of optical elements 32 are provided on the TFT layer 31. Further, the display panel 30 includes the display region 30*a* and the frame region 30*b* surrounding an outer periphery of the display region 30*a*.

A terminal portion 33 through which a signal is input from the flexible circuit 2*c* to the display region 30*a* is provided on one end of the frame region 30*b*. The bending portion 34 is provided between the terminal portion 33 and the display region 30*a*. In the bending portion 34, a slit 35 is formed in at least one inorganic insulating film of the TFT layer 31. Further, in the bending portion 34, the frame region 30*b* is bent. With this, the terminal portion 33 is oriented to face a back surface side of the display panel 30. In this manner, on the back surface of the display panel 30, the flexible circuit 2*c* and the terminal portion 33 are connected.

As a result, even when the display panel 30 is formed of a flexible substrate, the display panel 30 can be easily bent due to the bending portion 34 having the slit 35. Further, the flexible circuit 2*c* and the display panel 30 are easily connected to each other at the terminal portion 33.

Further, in this embodiment, the bending portion 34 is formed inside the U-shaped portion 11. With this, the bending portion 34 is covered inside the U-shaped portion 11, and hence the bending portion 34 can be invisible.

Further, in the hinge device 10C according to this embodiment, the flexible circuit 2*c* extending in the direction from the pin 12*a* of the hinge portion 12 to the terminal portion 33 hangs down substantially perpendicularly with respect to the display panel 30, and is bent at the position of being contact with the display panel 30. In this manner, the flexible circuit 2*c* is electrically connected to the terminal portion 33. With this, the terminal portion 33 provided to the end portion of the display panel 30 folded at the bending portion 34 is flush with the end portion of the flexible circuit 2*c*. As a result, the terminal portion 33 of the display panel 30 and the flexible circuit 2*c* are electrically connected to each other easily.

Supplement

The hinge device 10A, 10B, or 10C according to a first aspect of the disclosure is provided between the first housing (display part 3) and the second housing (keyboard part 2), and couples the first housing (display part 3) to the second housing (keyboard part 2) in an openable and closable manner. The hinge device includes the U-shaped portion 11 having a U-shaped cross section. The U-shaped portion 11 has one end portion integrally formed with the second housing (keyboard part 2) on the rear side of the second housing (keyboard part 2). The hinge portion 12 is provided in the other end portion of the U-shaped portion 11. The hinge portion 12 supports the back surface of the first housing (display part 3) in a rotatable manner to open and close the first housing (display part 3) with respect to the second housing (keyboard part 2). The recessed portion 13 is formed in the one end portion of the U-shaped portion 11. The recessed portion 13 prevents the lower end of the first housing (display part 3) and the one end portion of the U-shaped portion 11 from being brought into contact with each other when the first housing (display part 3) is rotated.

According to this configuration, the hinge device includes the U-shaped portion having a U-shaped cross section on the rear side of the second housing, and the U-shaped portion has the one end portion integrally formed with the second housing. Further, the U-shaped portion has the other end portion provided with the hinge portion. The hinge portion supports the back surface of the first housing in a rotatable manner to open and close the first housing with respect to the second housing.

In the hinge device described above, description is made about the case where the first housing is turned to open and close the first housing with respect to the second housing. In this case, when the sufficient distance between the lower end of the first housing and the far-side end of the second housing is secured, the first housing can freely open and close with respect to the second housing by freely turning the first housing. However, in the case of such design, when the first housing is in the open state with respect to the second housing, a gap between the lower end of the first housing and the far-side end of the second housing is generated, which leads to an unpleasant view.

Meanwhile, in recent years, a so-called frame has a tendency of being reduced or eliminated when the first housing is a display screen. In the case of such first housing, it is preferred that the lower end of the first housing is prevented from being covered by the second housing when viewed from the front obliquely-upward direction in the open state of the first housing with respect to the second housing.

When the first housing is in the open state with respect to the second housing, and is viewed from the front obliquely-upward direction, the lower end of the first housing and the far-side end of the second housing are required to be close to each other as much as possible to satisfy the condition described above and prevent the gap between the lower end of the first housing and the far-side end of the second housing from being generated.

However, in the case of such design, the lower end of the first housing is brought into contact with the one end portion of the U-shaped portion while the first housing is turned.

In view of this, in the hinge device according to one aspect of the disclosure, the recessed portion, which prevents the lower end of the first housing and the one end portion of the U-shaped portion from being brought into contact with each other when the first housing is rotated, is formed in the one end portion of the U-shaped portion.

With this, in the open state of the first housing with respect to the second housing, even when the lower end of the first housing and the far-side end of the second housing are close to each other as much as possible, the first housing can be rotated.

Further, the hinge device is configured with one end portion in which the recessed portion is formed and the other end portion which is provided with the U-shaped portion including the hinge portion. Thus, the configuration thereof is simple. Specifically, the hinge device has the only one hinge portion for turning the first housing, and the hinge portion is present on the back surface of the first housing. Further, the recessed portion is merely formed in the one end portion of the U-shaped portion.

Therefore, the hinge device with a simple configuration and an electronic device can be provided, the hinge device being invisible between the first housing and the second housing from the front obliquely-upward direction, and being capable of preventing the lower end of the first housing from being covered by the second housing when the first housing is in an open state.

In the hinge device 10A, 10B, or 10C according to a second aspect of the disclosure, it is preferred that the hinge portion 12 supports the back surface of the first housing (display part 3) at the position shifted from the lower end to the upper end of the first housing (display part 3).

For example, in the case where the hinge portion supports the back surface of the first housing at the lower end position of the first housing, when the first housing is in the open state with respect to the second housing, the distance between the lower end of the first housing and the far-side end of the second housing is increased. Thus, when the first housing is in the open state, there is a possibility that the hinge device is visible from the front obliquely-upward direction between the first housing and the second housing. Further, for example, such problem that a finger is caught between the lower end of the first housing and the far-side end of the second housing arises.

With respect to this point, in the hinge device according to an aspect of the disclosure, the hinge portion supports the back surface of the first housing at the position shifted from the lower end to the upper end of the first housing. Thus, such problem is less liable to arise.

In the hinge device 10A according to a third aspect of the disclosure, the recessed portion 13 (arc-shaped recessed portion 13a) is formed to have an arc-shaped cross section.

With this, the recessed portion can have a shape having an arc-shaped cross section along a turning radius of the first housing. As a result, the cross section of the recessed portion can be reduced. Thus, degradation in strength of the hinge device can be prevented.

In the hinge device 10B according to a fourth aspect of the disclosure, the recessed portion 13 (rectangular recessed portion 13b) is formed to have a rectangular cross section.

With this, the processing is easily performed when the recessed portion is formed to have a rectangular cross section.

In the hinge device 10A, 10B, or 10C according to a fifth aspect of the disclosure, a length of the hinge portion 12 in the direction parallel to the rotary shaft (pin 12a) for the first housing (display part 3) and the second housing (keyboard part 2) is an entire length of the first housing (display part 3) in the direction parallel to the rotary shaft (pin 12a).

With this, the length in the direction parallel to the rotary shaft of the hinge portion may be the entire width length of the first housing. Thus, the hinge portion can exert a higher supporting force for the first housing and the second housing.

In the hinge device 10A, 10B, or 10C according to a sixth aspect of the disclosure, a length of the hinge portion 12 in a direction parallel to the rotary shaft (pin 12a) for the first housing (display part 3) and the second housing (keyboard part 2) is a part of a length of the first housing (display part 3) in the direction parallel to the rotary shaft (pin 12a).

With this structure, the hinge portion and the hinge device can be reduced in weight.

It is preferred that the hinge device 10C according to a seventh aspect of the disclosure have the following configuration. That is, the first housing (display part 3) includes the display panel 3a. The second housing (keyboard part 2) includes the circuit substrate 2b. The hinge portion 12 includes the rotary shaft (pin 12a). The display panel 3a and the circuit substrate 2b are electrically connected through the flexible circuit 2c. The flexible circuit 2c has a width length equal to or smaller than at least half of a width of the display panel 3a, and is wound about the rotary shaft (pin 12a) without being fixed to the rotary shaft (pin 12a). The flexible circuit 2c toward the display panel 3a and the flexible circuit 2c toward the circuit substrate 2b are wound alternately.

With this, even when the first housing and the second housing open or close, the flexible circuit can operate with a certain tension. Further, the flexible circuit can assist an opening and closing movement of the first housing and the second housing. As a result, breakage of the flexible circuit, which is caused by a large tension applied to the flexible circuit, can be prevented.

It is preferred that the hinge device 10C according to an eighth aspect of the disclosure have the following configuration. That is, the display panel 30 is formed of a flexible substrate. The TFT layer 31 is provided on the flexible substrate, the plurality of optical elements 32 are provided on the TFT layer 31, the display panel 30 includes the display region 30a, and the frame region 30b surrounding the outer periphery of the display region 30a. The terminal portion 33 is provided to one end of the frame region 30b, the terminal portion 30b is configured to input a signal from the flexible circuit 2c to the display region 30a. The bending portion 34 is provided between the terminal portion 33 and the display region 30a. A slit 35 is provided to at least one inorganic insulating film of the TFT layer 31 in the bending portion 34. By bending the frame region 30b at the bending portion 34, the terminal portion 33 is oriented to face the back surface side of the display panel 30, and the flexible circuit 2c and the terminal portion 33 are connected on the back surface of the display panel 30.

With this, even when the display panel is formed of a flexible substrate, the display panel can be easily bent due to the bending portion having the slid. Further, the flexible circuit and the display panel are easily connected to each other at the terminal portion.

In the hinge device 10C according to a ninth aspect of the disclosure, the bending portion 34 is formed inside the U-shaped portion 11.

With this, the bending portion is covered inside the U-shaped portion, and the bending portion can be invisible.

In the hinge device 10C according to a tenth aspect of the disclosure, it is preferred that the flexible circuit 2c extending in the direction from the rotary shaft (pin 12a) of the hinge portion 12 to the terminal portion 33 is bent at a position being contact with the display panel 30, and is electrically connected with the terminal portion 33.

With this, the terminal portion provided to the end portion of the display panel folded at the bending portion is flush with the flexible circuit. As a result, the terminal portion of the display panel and the flexible circuit 2c are electrically connected to each other easily.

In the hinge device 10A, 10B, or 10C according to a eleventh aspect of the disclosure, it is preferred that the hinge portion 12 is provided to the back surface of the first housing (display part 3), and when the first housing (display part 3) is in the open state, the hinge portion 12 is configured not to be exposed from the first housing (display part 3).

With this, the hinge device excellent in design can be provided.

The electronic device (notebook-type personal computer 1A, 1B, or 1C) according to a twelfth aspect of the disclosure includes the hinge device (hinge device 10A, 10B, or 10C).

According to this configuration, there can be provided the electronic device including the hinge device with a simple configuration, the hinge device being invisible between the first housing and the second housing from the front obliquely-upward direction and being capable of preventing the lower end of the first housing from being covered by the second housing when the first housing is in an open state.

Note that, the disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Further, novel technical features may be formed by combining the technical approaches stated in each of the embodiments.

REFERENCE SIGNS LIST 1A, 1B Notebook-type personal computer (electronic device)
2 Keyboard part (second housing)
2a Keyboard
2b Circuit substrate
2c Flexible circuit
3 Display part (first housing)
3a Display panel
3b Glass plate
10A, 10B Hinge device
11 U-shaped portion
12 Hinge portion
12a Pin (rotary shaft)
12b U-shaped portion-side pin support member
12c Display part-side pin support member
13 Recessed portion
13a Arc-shaped recessed portion (recessed portion)
13b Rectangular recessed portion (recessed portion)
30 Display panel
30a Display region
30b Frame region
33 Terminal portion
34 Bending portion
35 Slit

The invention claimed is:

1. A hinge device being provided between a first housing and a second housing and coupling the first housing to the second housing in an openable and closable manner, the hinge device comprising:
a U-shaped portion having a U-shaped cross section, the U-shaped portion having one end portion integrally formed with the second housing on a rear side of the second housing, wherein
a hinge portion is provided in another end portion of the U-shaped portion, the hinge portion supporting a back surface of the first housing in a rotatable manner to open and close the first housing with respect to the second housing, the back surface of the first housing being a surface opposite to the second housing when the first housing is closed with respect to the second housing,
the first housing includes a lower end that is an end portion nearest to and facing the second housing with a gap between the end portion of the first housing and the second housing when the first housing is opened with respect to the second housing,
the lower end of the first housing is at least partially located in a space surrounded by the U-shaped portion when the first housing is closed with respect to the second housing, and
a recessed portion is located in the one end portion of the U-shaped portion, the recessed portion including a recess extending in a direction moving away from the space that prevents the lower end of the first housing from being brought into contact with the U-shaped portion when the first housing is rotated while opening the first housing from a closed state with respect to the second housing.

2. The hinge device according to claim 1, wherein:
the first housing includes an upper end that is an end portion thereof positioned farthest from the second housing when the first housing is opened with respect to the second housing,
the hinge portion supports the back surface of the first housing at a position shifted in an upper end direction from the lower end of the first housing, and
the upper end direction is a direction extending from the lower end of the first housing toward the upper end of the first housing.

3. The hinge device according to claim 1, wherein the recessed portion is formed to have an arc-shaped cross section.

4. The hinge device according to claim 1, wherein the recessed portion is formed to have a rectangular cross section.

5. The hinge device according to claim 1, wherein a length of the hinge portion in a direction parallel to a rotary shaft for the first housing and the second housing is an entire length of the first housing in the direction parallel to the rotary shaft.

6. The hinge device according to claim 1, wherein a length of the hinge portion in a direction parallel to the rotary shaft for the first housing and the second housing is a part of a length of the first housing in the direction parallel to the rotary shaft.

7. The hinge device according to claim 1, wherein the first housing includes a display panel,
the second housing includes a circuit substrate,
the hinge portion includes a rotary shaft,
the display panel and the circuit substrate are electrically connected through a flexible circuit,
the flexible circuit has a width length equal to or smaller than at least half of a width of the display panel, and is wound about the rotary shaft without being fixed to the rotary shaft, and
a flexible circuit toward the display panel and a flexible circuit toward the circuit substrate are wound alternately.

8. The hinge device according to claim 7, wherein the display panel is formed of a flexible substrate,
a TFT layer is provided on the flexible substrate,
a plurality of optical elements are provided on the TFT layer,
the display panel includes a display region, and a frame region surrounding an outer periphery of the display region,
a terminal portion is provided to one end of the frame region, the terminal portion is configured to input a signal from the flexible circuit to the display region,
a bending portion is provided between the terminal portion and the display region,
a slit is provided to at least one inorganic insulating film of the TFT layer in the bending portion, and
by bending the frame region at the bending portion, the terminal portion is oriented to face a back surface side of the display panel, and the flexible circuit and the terminal portion are connected on the back surface of the display panel.

9. The hinge device according to claim 8, wherein the bending portion is formed inside the U-shaped portion.

10. The hinge device according to claim 8, wherein the flexible circuit extending in a direction from the rotary shaft of the hinge portion to the terminal portion is bent at a position being contact with the display panel, and is electrically connected to the terminal portion.

11. The hinge device according to claim 1, wherein the hinge portion is provided to the back surface of the first housing, and
when the first housing is in an open state, the hinge portion is configured not to be exposed from the first housing.

12. An electronic device, comprising the hinge device of claim 1.

13. A hinge device being provided between a first housing and a second housing and coupling the first housing to the second housing in an openable and closable manner, the hinge device comprising:
a U-shaped portion having a U-shaped cross section, the U-shaped portion having one end portion integrally formed with the second housing on a rear side of the second housing, wherein
a hinge portion is provided in another end portion of the U-shaped portion, the hinge portion supporting a back surface of the first housing in a rotatable manner to open and close the first housing with respect to the second housing,
a recessed portion is located in the one end portion of the U-shaped portion, the recessed portion preventing a lower end of the first housing and one end portion of the U-shaped portion from being brought into contact with each other when the first housing is rotated,
the first housing includes a display panel,
the second housing includes a circuit substrate,
the hinge portion includes a rotary shaft,
the display panel and the circuit substrate are electrically connected through a flexible circuit,
the flexible circuit has a width length equal to or smaller than at least half of a width of the display panel, and is wound about the rotary shaft without being fixed to the rotary shaft,
a flexible circuit toward the display panel and a flexible circuit toward the circuit substrate are wound alternately,
the display panel is formed of a flexible substrate,
a TFT layer is provided on the flexible substrate,
a plurality of optical elements are provided on the TFT layer,
the display panel includes a display region, and a frame region surrounding an outer periphery of the display region,
a terminal portion is provided to one end of the frame region,
the terminal portion is configured to input a signal from the flexible circuit to the display region,
a bending portion is provided between the terminal portion and the display region,
a slit is provided in at least one inorganic insulating film of the TFT layer in the bending portion,
by bending the frame region at the bending portion, the terminal portion is oriented to face a back surface side of the display panel, and
the flexible circuit and the terminal portion are connected on the back surface of the display panel.

* * * * *